United States Patent
Ikura

(10) Patent No.: US 11,901,298 B2
(45) Date of Patent: Feb. 13, 2024

(54) SEMICONDUCTOR DEVICE AND METHOD OF MANUFACTURING THE SAME

(71) Applicant: RENESAS ELECTRONICS CORPORATION, Tokyo (JP)

(72) Inventor: Kenji Ikura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 81 days.

(21) Appl. No.: 17/520,461

(22) Filed: Nov. 5, 2021

(65) Prior Publication Data

US 2022/0165671 A1 May 26, 2022

(30) Foreign Application Priority Data

Nov. 24, 2020 (JP) .................................. 2020-194040

(51) Int. Cl.
*H01L 23/538* (2006.01)
*H01L 23/00* (2006.01)

(52) U.S. Cl.
CPC ...... *H01L 23/5384* (2013.01); *H01L 23/5386* (2013.01); *H01L 24/04* (2013.01); *H01L 24/95* (2013.01)

(58) Field of Classification Search
CPC . H01L 23/5384; H01L 23/5386; H01L 24/04; H01L 24/95
See application file for complete search history.

(56) References Cited

U.S. PATENT DOCUMENTS

| | | | | |
|---|---|---|---|---|
| 5,177,863 | A * | 1/1993 | Lam ..................... | H01L 23/13 29/830 |
| 9,111,846 | B1 * | 8/2015 | Whang ................ | H01L 25/18 |
| 10,134,705 | B2 | 11/2018 | Matsubara | |
| 2003/0153122 | A1 * | 8/2003 | Brooks ................ | H01L 24/06 257/784 |
| 2007/0158855 | A1 * | 7/2007 | Minamio ............ | H01L 23/5384 257/E23.174 |
| 2012/0100672 | A1 * | 4/2012 | Brooks ................ | H01L 24/06 438/123 |
| 2013/0176763 | A1 * | 7/2013 | Ware ................... | H01L 23/5384 365/51 |
| 2014/0103096 | A1 * | 4/2014 | Zhang ................. | H01L 22/12 228/104 |
| 2015/0228618 | A1 * | 8/2015 | Kawanabe ........... | H01L 24/05 438/652 |
| 2016/0057864 | A1 * | 2/2016 | Matsuyama ......... | H01L 24/00 361/783 |
| 2016/0163631 | A1 * | 6/2016 | Truax ................. | H01L 23/49811 257/784 |
| 2017/0283256 | A1 * | 10/2017 | Lee ..................... | G01R 31/2607 |
| 2018/0019194 | A1 * | 1/2018 | Papillon ............. | H01L 23/49575 |

(Continued)

FOREIGN PATENT DOCUMENTS

JP 2018-107269 A 7/2018

*Primary Examiner* — Nathan W Ha
(74) *Attorney, Agent, or Firm* — Rimon, P.C.

(57) ABSTRACT

A semiconductor device has a semiconductor chip having a plurality of pads and wires electrically connected to the plurality of pads, respectively. The plurality of pads includes a plurality of first pads which is electrically connected to a circuit included in the semiconductor chip and to which first wires are bonded and a second pad which is an electrode pad for wire connection test and to which a second wire is bonded.

6 Claims, 8 Drawing Sheets

(56) References Cited

U.S. PATENT DOCUMENTS

| | | | |
|---|---|---|---|
| 2019/0067171 A1* | 2/2019 | Estacio | H01L 23/49575 |
| 2019/0079128 A1* | 3/2019 | Licausi | G01R 31/2601 |
| 2020/0211972 A1* | 7/2020 | Min | H01L 23/498 |
| 2021/0035889 A1* | 2/2021 | Kageyama | H01L 23/3142 |
| 2021/0082779 A1* | 3/2021 | Chen | H01L 24/20 |
| 2021/0167016 A1* | 6/2021 | Lu | H01L 23/5389 |
| 2021/0183779 A1* | 6/2021 | Cheah | H01L 21/50 |
| 2021/0366874 A1* | 11/2021 | Choi | G11C 5/06 |
| 2022/0137102 A1* | 5/2022 | Inoguchi | G01R 19/0092 438/15 |
| 2022/0328412 A1* | 10/2022 | Jung | H01L 23/5384 |

* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2020-194040 filed on Nov. 24, 2020 including the specification, drawings and abstract is incorporated herein by reference in its entirety.

BACKGROUND

The present invention relates to a semiconductor device and a method of manufacturing the same.

There is a technology for electrically connecting electrode pads of a semiconductor chip and terminals arranged around the semiconductor chip via wires (see, for example, Patent Document 1).

THERE ARE DISCLOSED TECHNIQUES LISTED BELOW

[Patent Document 1] Japanese Unexamined Patent Application Publication No. 2018-107269

SUMMARY

The wire bonding for connecting wires to a semiconductor chip is performed using a manufacturing apparatus called a wire bonder. In order to stably perform the wire bonding using the wire bonder, it is preferable to regularly carry out a wire connection test for confirming the operating state of the wire bonder. From the viewpoint of accurately measuring the operating state of the wire bonder, it is preferable to carry out the wire connection test frequently. On the other hand, when it is necessary to prepare a semiconductor chip for the wire connection test, the manufacturing efficiency of the semiconductor device decreases in inverse proportion to the frequency of the wire connection test.

The other problems and the novel features will be apparent from the description of this specification and accompanying drawings.

A semiconductor device according to an embodiment includes: a semiconductor chip having a first main surface, a second main surface on an opposite side of the first main surface, and a plurality of electrode pads exposed on the first main surface; and wires electrically connected to the plurality of electrode pads, respectively. The plurality of electrode pads includes: a plurality of first electrode pads which is electrically connected to a circuit included in the semiconductor chip and to which first wires are bonded; and a second electrode pad which is an electrode pad for wire connection test and to which a second wire is bonded.

According to the embodiment described above, it is possible to suppress the decrease in manufacturing efficiency of the semiconductor device due to the increase in frequency of the wire connection test.

DETAILED DESCRIPTION

Figure 1:
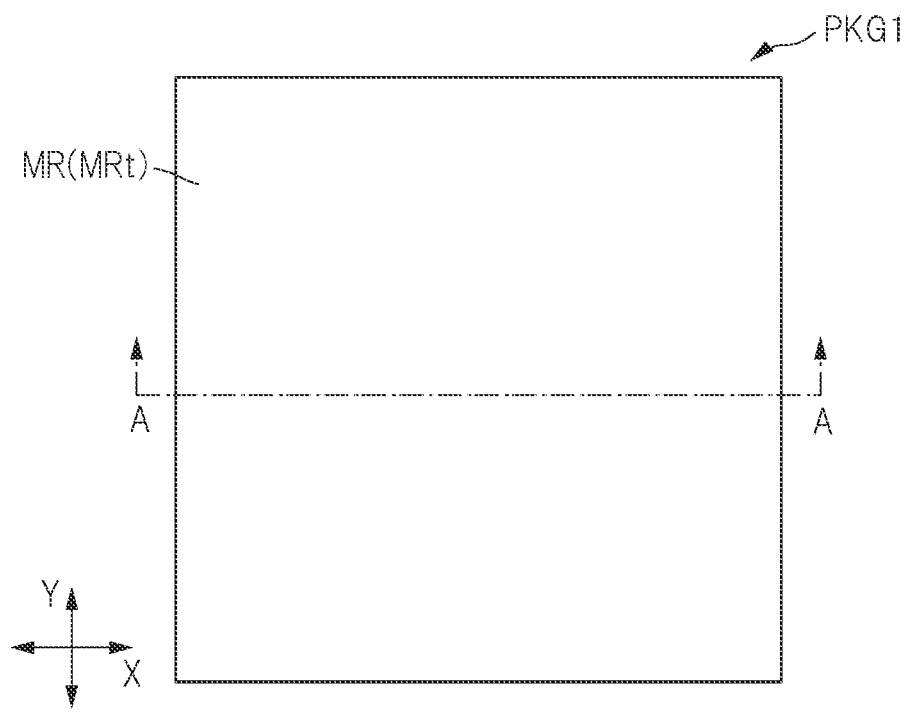
FIG. 1 is a top view of a semiconductor device according to an embodiment.

Explanation of Description Form, Basic Terminology, and Usage in Present Application In the present application, the embodiments will be described in a plurality of sections or the like when required as a matter of convenience. However, these sections or the like are not irrelevant to each other unless otherwise stated, and a part of one example relates to the other example as details or a part or the entire of a modification regardless of the order of description. Also, the repetitive description of similar parts will be omitted in principle. Further, the constituent elements in the embodiments are not always indispensable unless otherwise stated or except for the case where the constituent elements are theoretically indispensable in principle or the constituent elements are obviously indispensable from the context.

Likewise, in the description of the embodiments, the phrase "X made of A" for a material, a composition or the like is not intended to exclude those containing elements other than A unless otherwise specified and except for the case where it clearly contains only A from the context. For example, as for a component, it means "X containing A as a main component". For example, a "silicon member" or the like is not limited to pure silicon and it is obvious that the silicon member includes a member made of silicon germanium (SiGe) alloy, a member made of multicomponent alloy containing silicon as a main component, and a member containing other additives or the like. In addition, when mentioning gold plating, a Cu layer, nickel plating or the like, it includes a member containing gold, Cu, nickel or the like as a main component as well as a pure one unless otherwise specified clearly.

In addition, when referring to a specific value or amount, a value or amount larger or smaller than the specific value or amount is also applicable unless otherwise stated or except for the case where the value or amount is logically limited to the specific value or amount and the value or amount is apparently limited to the specific value or amount from the context.

Further, in the drawings for the embodiments, the same or similar parts are denoted by the same or similar reference characters or reference numbers, and the descriptions thereof are not repeated in principle.

In addition, in the accompanying drawings, hatching may be omitted even in cross-sections in the case where the hatchings make the drawings complicated on the contrary or discrimination from void is clear. In relation to this, when it is clear from the description or the like, an outline of a background may be omitted even in a planarly closed hole. Furthermore, even in the cases other than the cross-section, hatching or dot pattern may be applied so as to clarify that a portion is not a vacant space or clearly illustrate the boundary between regions.

In the following embodiments, as an example of a semiconductor device including a semiconductor chip and a plurality of wires connected to the semiconductor chip, a semiconductor package in which the semiconductor chip is mounted on a wiring board and the semiconductor chip and the wiring board are electrically connected via the plurality of wires will be described. However, there are various modifications as the semiconductor device to which the technology described below can be effectively applied. For example, the technology described below can be applied to a lead product in which a plurality of electrode pads of a semiconductor chip mounted on a die pad and a plurality of leads arranged around the die pad are electrically connected via wires. As described above, the technology described below can be applied to various semiconductor devices in the range of satisfying the conditions that a semiconductor chip having a plurality of electrode pads is provided and a wire is connected to each of the plurality of electrode pads.

<Semiconductor Device>

Figure 2:
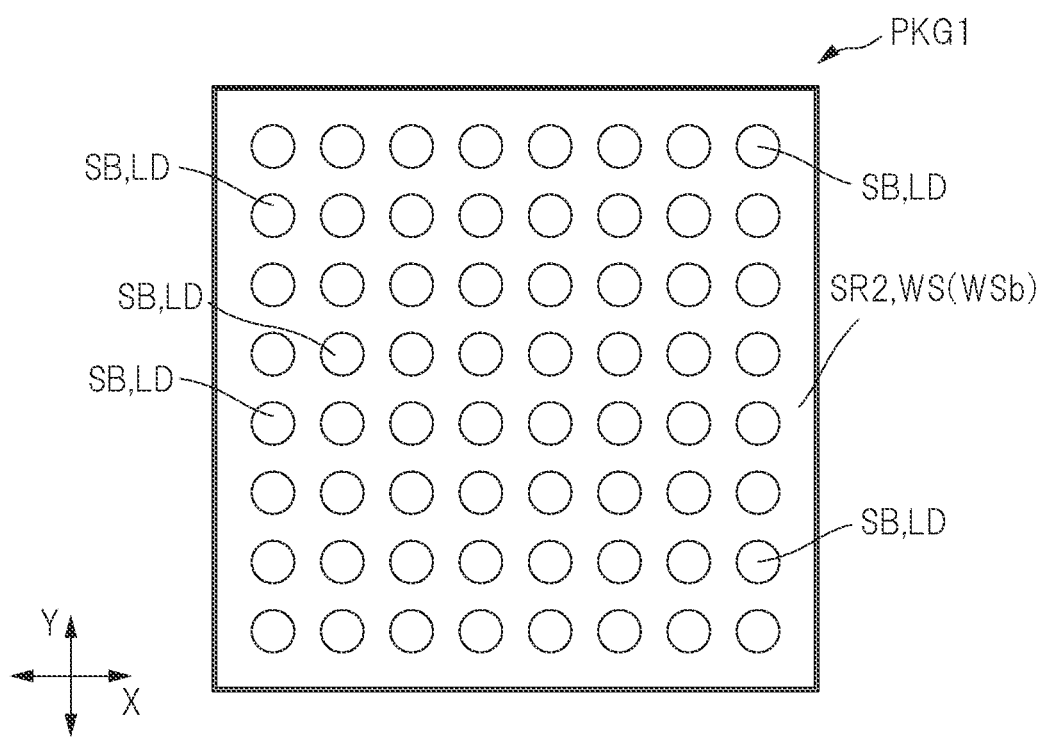
FIG. 2 is a bottom view showing a mounting surface side of the semiconductor device shown in FIG. 1.
Figure 3:
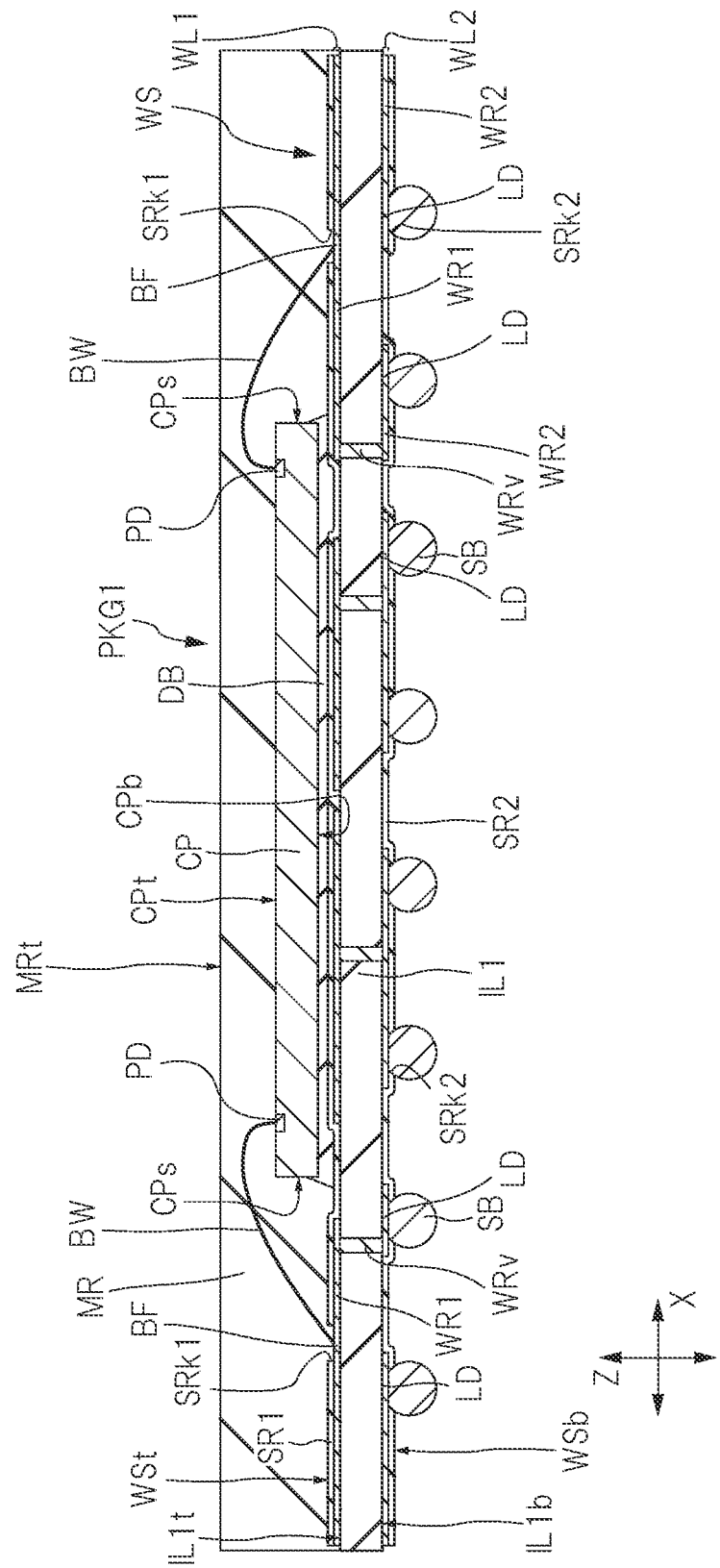
FIG. 3 is a cross-sectional view along a line A-A in FIG. 1.
Figure 4:
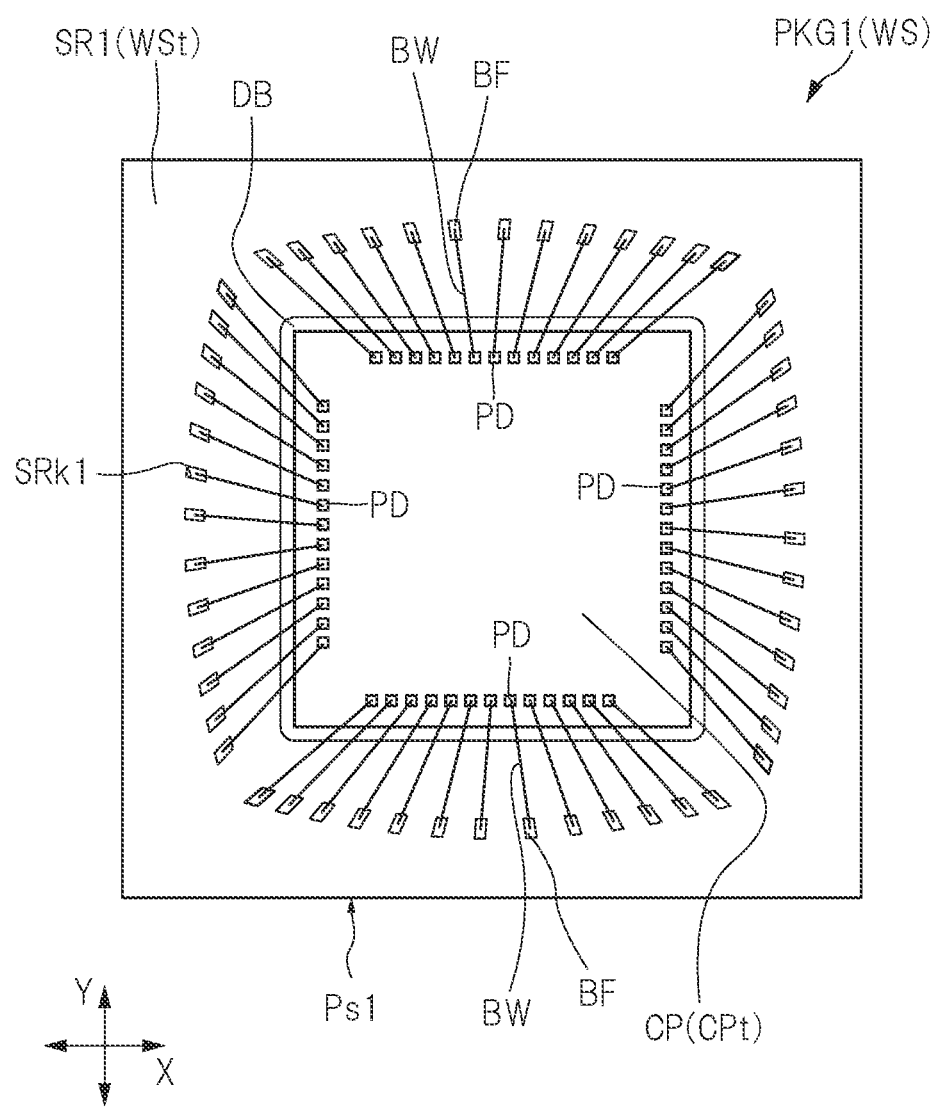
FIG. 4 is a perspective plan view showing an upper surface side of a wiring board in a state where a sealing body shown in FIG. 1 is removed.

FIG. 1 is a top view showing an upper surface side of a semiconductor device according to the present embodiment. FIG. 2 is a bottom view showing a mounting surface side of the semiconductor device shown in FIG. 1. FIG. 3 is a cross-sectional view along a line A-A in FIG. 1. FIG. 4 is a perspective plan view showing an upper surface side of a wiring board in a state where a sealing body shown in FIG. 1 is removed.

As shown in FIG. 1 and FIG. 2, a semiconductor device PKG1 has a quadrangular shape in a plan view. Although FIG. 1 and FIG. 2 show an example in which the planar shape of the semiconductor device PKG1 is a square, it may be a rectangle or the like. As shown in FIG. 3, the semiconductor device PKG1 of the present embodiment includes a wiring board WS, a semiconductor chip CP mounted on the wiring board WS, and a sealing body MR that seals the semiconductor chip CP. The semiconductor chip CP and the wiring board WS are connected via wires BW. The sealing body MR is formed on an upper surface (chip mounting surface, main surface) WSt of the wiring board WS and covers the entire upper surface WSt. Also, the sealing body MR entirely covers the semiconductor chip CP and the plurality of wires BW.

As shown in FIG. 3, the wiring board WS has an upper surface WSt and a lower surface (mounting surface, main surface) WSb on an opposite side of the upper surface WSt. Also, the wiring board WS includes an insulating layer IL1 serving as a base material, an insulating film (protective film, solder resist film) SR1 covering an upper surface (main surface, surface) IL1$t$ of the insulating layer IL1, and an insulating film (protective film, solder resist film) SR2 covering a lower surface (main surface, surface) IL1$b$ of the insulating layer IL1. The upper surface ILt of the insulating layer IL1 is a surface facing the semiconductor chip CP, and the lower surface IL1$b$ is a surface on an opposite side of the upper surface IL1$t$. The insulating layer IL1 is made of, for example, a prepreg in which glass fibers are impregnated with resin. The insulating films SR1 and SR2 are protective films that prevent short-circuits and disconnections between a plurality of wirings. The insulating film SR1 is formed on the upper surface WSt which is the uppermost surface of the wiring board WS, and the insulating film SR2 is formed on the lower surface WSb which is the lowermost surface of the wiring board WS.

Also, the wiring board WS includes a wiring layer WL1 which is arranged on a side of the upper surface IL1$t$ of the insulating layer IL1 and in which a plurality of conductor patterns is formed and a wiring layer WL2 which is arranged on a side of the lower surface IL1$b$ of the insulating layer IL1 and in which a plurality of conductor patterns is formed. The conductor patterns formed in the wiring layer WL1 include a plurality of terminals BF. Each of the plurality of terminals BF is exposed from the insulating film SR1 on the upper surface WSt of the wiring board WS. Openings SRk1 are formed in the insulating film SR1, and the terminals BF are exposed from the insulating film SR1 in the openings SRk1. Also, the conductor patterns formed in the wiring layer WL1 include a wiring WR1 connected to the terminal BF. The wiring WR1 is covered with the insulating film SR1. The conductor patterns formed in the wiring layer WL2 include a plurality of lands (terminals) LD. Each of the plurality of lands LD is exposed from the insulating film SR2 on the lower surface WSb of the wiring board WS. Openings SRk2 are formed in the insulating film SR2, and the lands LD are exposed from the insulating film SR2 in the openings SRk2. Also, the conductor patterns formed in the wiring layer WL2 include a wiring WR2 connected to the land LD. The wiring WR2 is covered with the insulating film SR2.

The wiring board WS includes a plurality of via wirings WRv that penetrates the insulating layer IL1 in the thickness direction (Z direction in FIG. 3). The via wiring WRv is an interlayer conductive path that electrically connects the wiring layer WL1 and the wiring layer WL2. The plurality of terminals BF and the plurality of lands LD are electrically connected via the plurality of via wirings WRv. The via wiring extends from one side of the upper surface WSt or the lower surface WSb (for example, the side of the upper surface WSt) to the other side (for example, the side of the lower surface WSb).

A plurality of solder balls (solder materials) SB is connected to each of the plurality of lands LD. The land LD and the solder ball SB are external electrodes (external connection terminals) for electrically connecting the semiconductor device PKG1 and the mounting board (motherboard). As shown in FIG. 2, the plurality of lands LD and solder balls SB are arranged in a matrix on the lower surface WSb.

In the present embodiment, the wiring board SW having two wiring layers WL1 and WL2 as shown in FIG. 3 will be described as an example. However, the number of wiring layers included in the wiring board WS is not limited to two, and may be, for example, three or more. For example, a build-up insulating layer made of resin may be arranged between the insulating layer IL1 and the insulating film SR1 and between the insulating layer IL1 and the insulating film SR2 shown in FIG. 3, respectively. In this case, since two wiring layers can be arranged on the side of the upper surface IL1$t$ and the side of the lower surface IL1$b$ of the insulating layer IL1, the wiring board having a total of four wiring layers can be obtained. Further, in the example shown in FIG. 2, each of the plurality of solder balls SB (plurality of lands LD) is arranged at equal intervals. However, the arrangement of the plurality of solder balls SB (plurality of lands LD) is not limited to that shown in FIG. 2. For example, of the plurality of solder balls SB (plurality of lands LD), the arrangement interval of some solder balls SB (lands LD) may be different from the arrangement interval of the other solder balls SB (lands LD).

Further, as shown in FIG. 2 and FIG. 4, the upper surface WSt (see FIG. 4) and the lower surface WSb (see FIG. 4) of the wiring board WS form a quadrangle. The semiconductor chip CP is mounted on the upper surface WSt of the wiring board WS. As shown in FIG. 4, for example, the semiconductor chip CP forms a quadrangle along the outer shape of the wiring board WS in a plan view, and is arranged at substantially the center (center portion) of the upper surface WSt. A plurality of terminals (bonding leads, bonding pads) BF is formed on the upper surface WSt around the semiconductor chip CP. The plurality of terminals BF is a bonding pad for electrically connecting the wire BW and the wiring board WS, and is made of, for example, metal such as copper (Cu).

Further, the plurality of terminals BF is arranged along each side of the semiconductor chip CP. In the example shown in FIG. 4, the plurality of terminals BF is arranged in a row along each side of the semiconductor chip CP. As a modification, the plurality of terminals BF may be arranged in a plurality of rows along each side of the semiconductor chip CP. In the example shown in FIG. 4, the openings SRk1 are formed so as to correspond to the plurality of terminals BF, respectively, and the periphery of each terminal BF is covered with the insulating film SR1. However, as a modification, the opening SRk1 may be formed over the plurality of terminals BF. In this case, the plurality of terminals BF is arranged in one opening SRk1, and the insulating layer IL1 (see FIG. 3) is exposed between the adjacent terminals BF.

Next, the semiconductor chip CP mounted on the wiring board WS will be described. As shown in FIG. 3, the semiconductor chip CP has a front surface (main surface) CPt, a back surface (main surface) CPb on an opposite side of the front surface CPt, and side surfaces CPs located between the front surface CPt and the back surface CPb. Also, as shown in FIG. 4, the planar shape of the semiconductor chip CP (shape of the front surface CPt and the back surface CPb) is a quadrangle. Although FIG. 4 shows an example in which the planar shape of the semiconductor chip CP is a square, it may be a rectangle or the like. A plurality of pads (electrodes, chip electrodes) PD is formed on the front surface CPt of the semiconductor chip CP. The plurality of pads PD is arranged in the outer edge of the front surface CPt along each side of the semiconductor chip CP.

A plurality of semiconductor elements (circuit elements) such as diodes and transistors is formed between the front surface CPt and the back surface CPb of the semiconductor chip CP, and is electrically connected to the plurality of pads PD via wirings (wiring layers) (not shown) formed on the semiconductor element. As described above, the semiconductor chip CP constitutes an integrated circuit by the plurality of semiconductor elements formed on a semiconductor substrate and the wirings for electrically connecting the plurality of semiconductor elements.

The base material (semiconductor substrate) having the semiconductor element forming surface of the semiconductor chip CP is made of, for example, silicon (Si). Further, a passivation film (not shown) which is an insulating film is formed on the front surface CPt which is the outermost surface of the semiconductor chip CP, and each surface of the plurality of pads PD is exposed from the passivation film in the opening formed in the passivation film.

Also, the pad PD is made of metal, and is made of, for example, aluminum (Al) in the present embodiment. Further, a metal film such as a gold (Au) film or a stacked film thereof may be formed on the surface of the pad PD via, for example, a nickel (Ni) film.

Further, in the present embodiment, the semiconductor chip CP is mounted on the wiring board WS by the so-called face-up mounting method in which the back surface CPb and the upper surface WSt of the wiring board WS face each other. The semiconductor chip CP is fixed to a chip mounting region CPr (see FIG. 6 described later) on the upper surface WSt via an adhesive DB. The adhesive DB is not particularly limited as long as it can firmly fix the semiconductor chip CP to the upper surface WSt of the wiring board WS, and a die bond material containing epoxy-based thermosetting resin is used in the present embodiment.

Also, as shown in FIG. 3 and FIG. 4, the semiconductor chip CP is electrically connected to the wiring board WS via a plurality of wires BW, respectively. Specifically, one end of the wire BW is connected to the pad PD on the front surface CPt of the semiconductor chip CP, and the other end is connected to the terminal BF of the wiring board WS. The wire BW is made of a metal material such as gold (Au) or copper (Cu).

The sealing body MR that seals each of the semiconductor chip CP, the plurality of wires BW, and the plurality of terminals BF shown in FIG. 3 will be described. As shown in FIG. 1, an upper surface MRt of the sealing body MR forms a quadrangle. Although the details will be described later, the semiconductor device PKG1 is manufactured by a method in which a sealing body is formed so as to collectively cover a plurality of device regions, and then the sealing body and the wiring board are cut at once. In the case of this method, the side surface of the sealing body MR and the side surface of the wiring board WS are formed so as to be continuously flush with each other. In other words, the side surface of the sealing body MR and the side surface of the wiring board WS overlap in the thickness direction of the semiconductor device PKG1.

The sealing body MR is, for example, an insulative resin body mainly made of thermosetting resin such as epoxy resin, a curing agent, and a large number of filler particles such as silica. Further, carbon particles are mixed in the sealing body MR as a colorant. As shown in FIG. 3, the sealing body MR is cured in a state of being in close contact with the semiconductor chip CP and the plurality of wires BW arranged inside the package. Namely, the sealing body MR has a function of protecting the semiconductor chip CP and the plurality of wires BW.

<Details of Electrode Pad>

Figure 5:
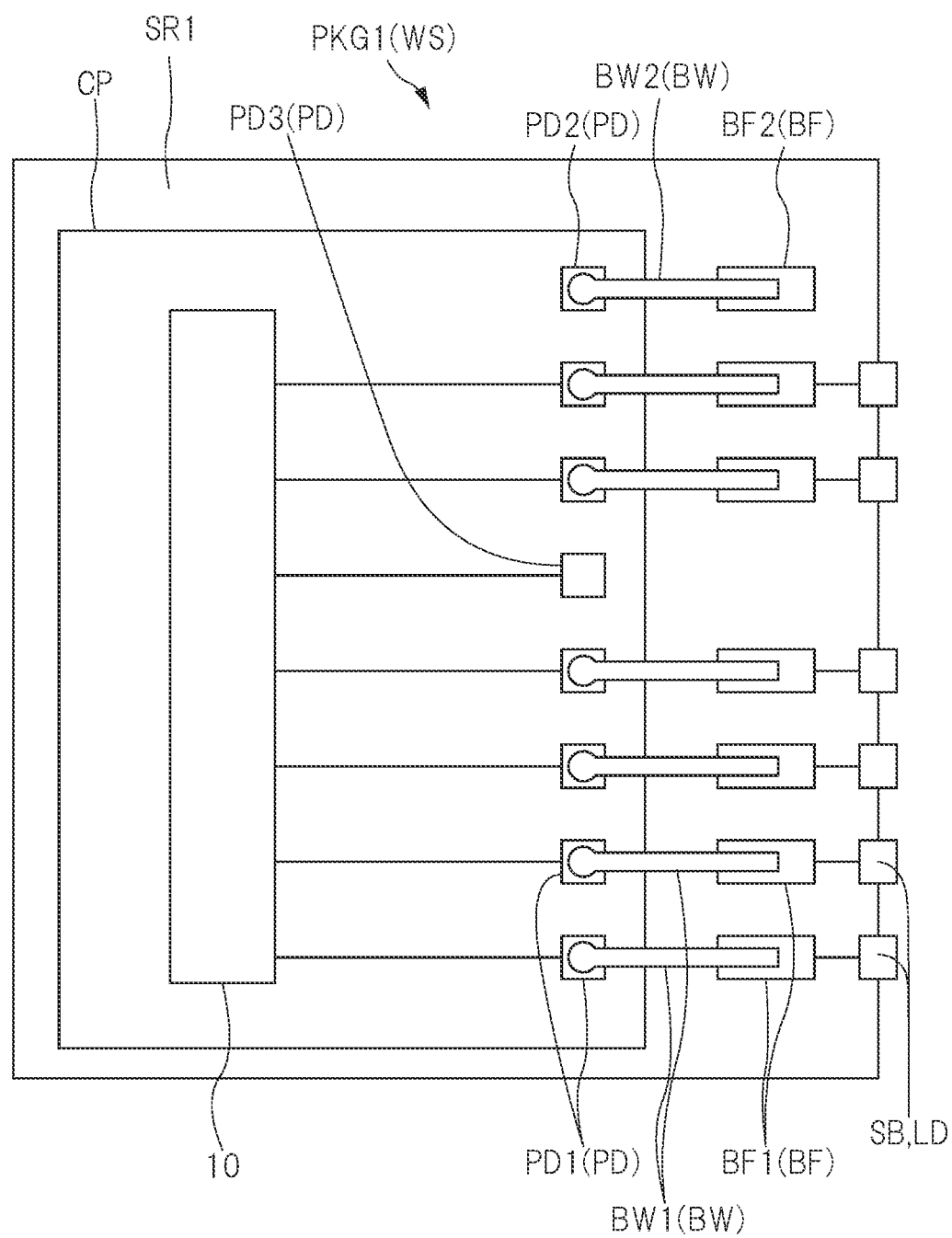
FIG. 5 is an explanatory diagram schematically showing an electrical connection relationship of some of a plurality of electrode pads shown in FIG. 4.

Next, the details of the plurality of pads PD shown in FIG. 4 will be described. FIG. 5 is an explanatory diagram schematically showing an electrical connection relationship of some of the plurality of electrode pads shown in FIG. 4.

As shown in FIG. 5, the plurality of pads PD includes a plurality of pads (electrode pads) PD1 which is electrically connected to a circuit 10 included in the semiconductor chip CP and to which wires BW1 are bonded and a pad (electrode pad) PD2 which is an electrode pad for the connection test of the wire BW and is electrically separated from the circuit 10 included in the semiconductor chip CP and to which a wire BW2 is bonded. Namely, in the case of the present embodiment, the semiconductor chip CP built in the semiconductor device PKG1 used as a product includes the pad PD2 for the connection test.

The pad PD1 and the wire BW1 are the pad PD and the wire BW that form an electrical connection path for exerting the function of the semiconductor device PKG1 in use. On the other hand, the pad PD2 and the wire BW2 are the pad PD and the wire BW for the test used for confirming the operating state of the wire bonder when connecting the plurality of wires BW in the manufacturing process of the semiconductor device PKG1.

Therefore, the pad PD1 needs to be electrically connected to the circuit 10 included in the semiconductor chip CP. The circuit 10 is an integrated circuit formed in the semiconductor chip CP, and is, for example, a core circuit such as an arithmetic processing circuit, a memory circuit, or a control circuit, an input/output circuit that controls the input and output of signals, or a power supply circuit that controls the power to drive the core circuit and the input/output circuit.

On the other hand, since the pad PD2 is the pad PD for the connection test of the wire BW as described above, it is desirable that the pad PD2 is electrically separated from the circuit 10 of the semiconductor chip CP. When the semiconductor chip CP includes a plurality of circuits including the circuit 10, it is preferable that the pad PD2 is separated from each of the plurality of circuits. The pad PD2 is electrically connected to a terminal BF2 via the wire BW2. Therefore, in order to prevent the conductive path from the pad PD2 to the terminal BF2 from affecting the circuits in the semiconductor chip CP, it is preferable that the pad PD2 is electrically separated from all the circuits in the semiconductor chip CP.

Although the details will be described later, since the pad PD2 for the connection test of the wire BW is formed in the semiconductor chip CP to be a product in the manufacturing process of the semiconductor device PKG1, the operating state of the wire bonder can be accurately measured for each product. Further, since the pad PD2 for the connection test of the wire BW is formed in the semiconductor chip CP to be a product in the manufacturing process of the semiconductor device PKG1, there is no need to prepare a dummy product for the connection test of the wire BW in the manufacturing process of the semiconductor device PKG1. Therefore, in the manufacturing process of the semiconductor device PKG1, the time loss between the connection test of the wire BW and the connecting process of the wire BW1 functioning as a product can be reduced. As a result, even if the frequency of the connection test of the wire BW increases, it is possible to suppress the decrease in the manufacturing efficiency of the semiconductor device PKG1.

In the example shown in FIG. 5, the plurality of terminals BF included in the wiring board WS includes the plurality of terminals BF1 connected to the pads PD1 via the wires BW1 and the terminal BF2 connected to the pad PD2 via the wire BW2. The terminal BF1 and the terminal BF2 are electrically separated. This case is preferable in that the conductive path composed of the pad PD2 and the wire BW2 and the circuit in the semiconductor chip CP can be completely separated.

Figure 6:
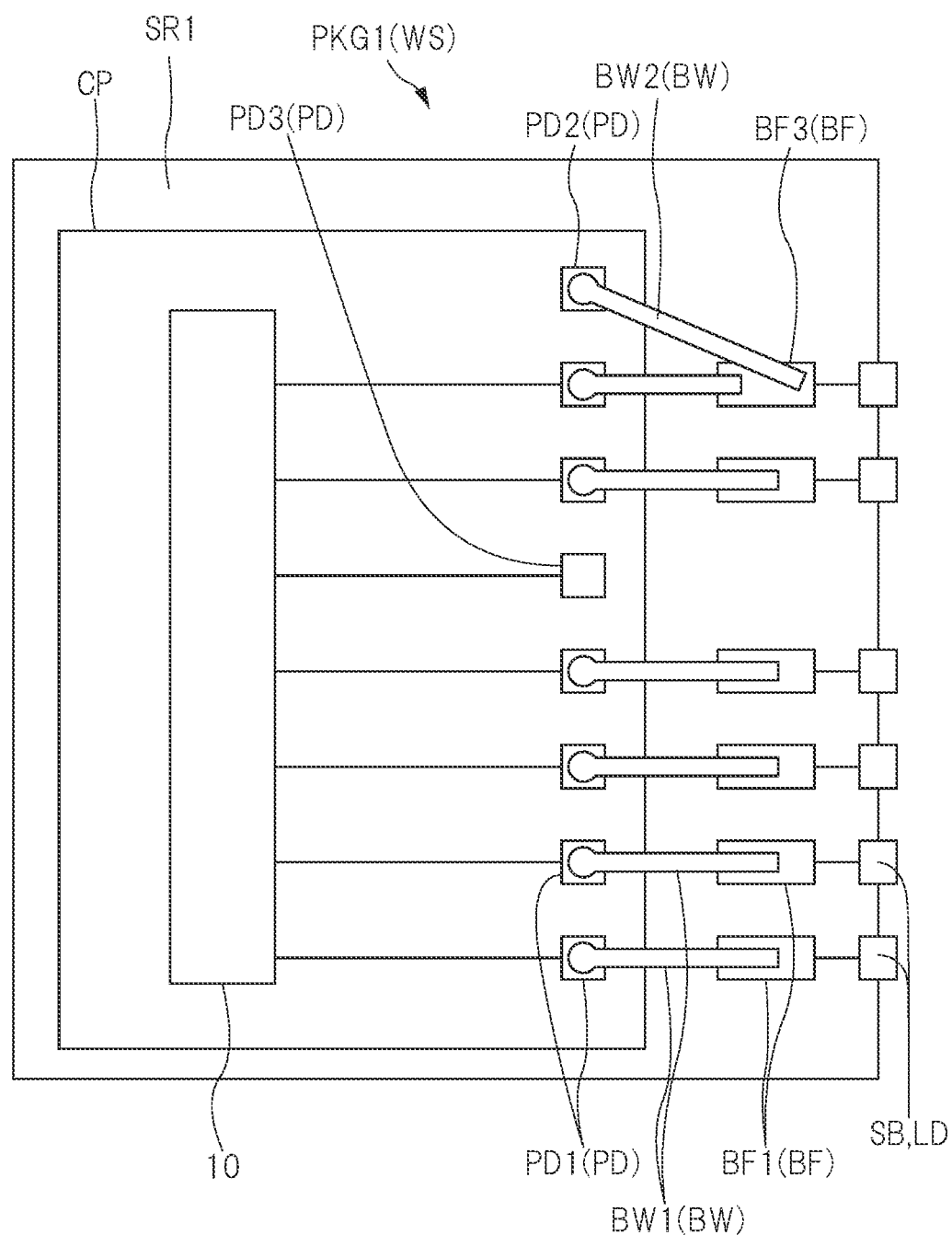
FIG. 6 is an explanatory diagram showing a modification with respect to FIG. 5.

There is the mode shown in FIG. 6 as a modification to the present embodiment. FIG. 6 is an explanatory diagram showing a modification with respect to FIG. 5. In the case of a semiconductor device PKG2 of the modification shown in FIG. 6, the wire BW2 is connected to one of the plurality of terminals BF to which the wires BW1 are connected. In other words, in the case of the semiconductor device PKG2 of the modification shown in FIG. 6, the plurality of terminals BF includes the plurality of terminals BF1 connected to the plurality of pads PD1 via the wires BW1 and a terminal BF3 connected to the pad PD2 via the wire BW2 and to the pad PD1 via the wire BW1. In the case of the semiconductor device PKG2, the circuit 10 in the semiconductor chip CP is electrically connected to the pad PD2 via the pad PD1, the wire BW1, the terminal BF1, and the wire BW2. However, in the semiconductor chip CP, the pad PD2 is separated from the circuit 10 in the semiconductor chip CP. Therefore, when compared with the case where the pad PD2 and the circuit 10 are connected in the semiconductor chip CP, the influence of the conductive path composed of the pad PD2 and the wire BW2 on the semiconductor chip CP can be reduced. Further, since it is not necessary to form the terminal BF for the wire connection test in the case of the semiconductor device PKG2, the degree of freedom in designing the wiring board WS can be improved.

As shown in FIG. 5 and FIG. 6, the plurality of pads PD includes a pad (electrode pad) PD3 which is connected to the circuit 10 and to which the wire BW is not connected. This pad PD3 is a so-called NC (Non-Connected) pad in which whether or not the wire connection thereto is necessary is selected depending on the intended use of the product. When the pad PD3 is connected to a terminal (not shown), the function of the circuit 10 of the semiconductor chip CP can be changed. The pad PD3 which is the NC pad and the pad PD2 for confirming the connection of the wire BW are distinguished from each other. Since the pad PD3 is a terminal for the function selection, it is not connected to the wiring board WS in principle. As another modification with respect to FIG. 5, similarly to the terminal BF2 shown in FIG. 5, the terminal BF which is not connected to the land LD and the pad PD3 may be electrically connected via the wire BW. However, in this case, since the pad PD3 that functions as the pad PD for the connection confirmation and the circuit 10 are electrically connected, it is necessary to reduce the influence on the circuit 10. For example, since the wire BW2 connected to the pad PD2 shown in FIG. 5 is electrically separated from the circuit 10, the wire bonding thereof may be performed under different conditions from the other wires BW in consideration that the operating state of the wire bonder is confirmed preferentially. On the other hand, when the wire BW is connected to the pad PD3, it is preferable to perform the wire bonding under the same conditions as the other wires BW.

<Method of Manufacturing Semiconductor Device>

Figure 7:
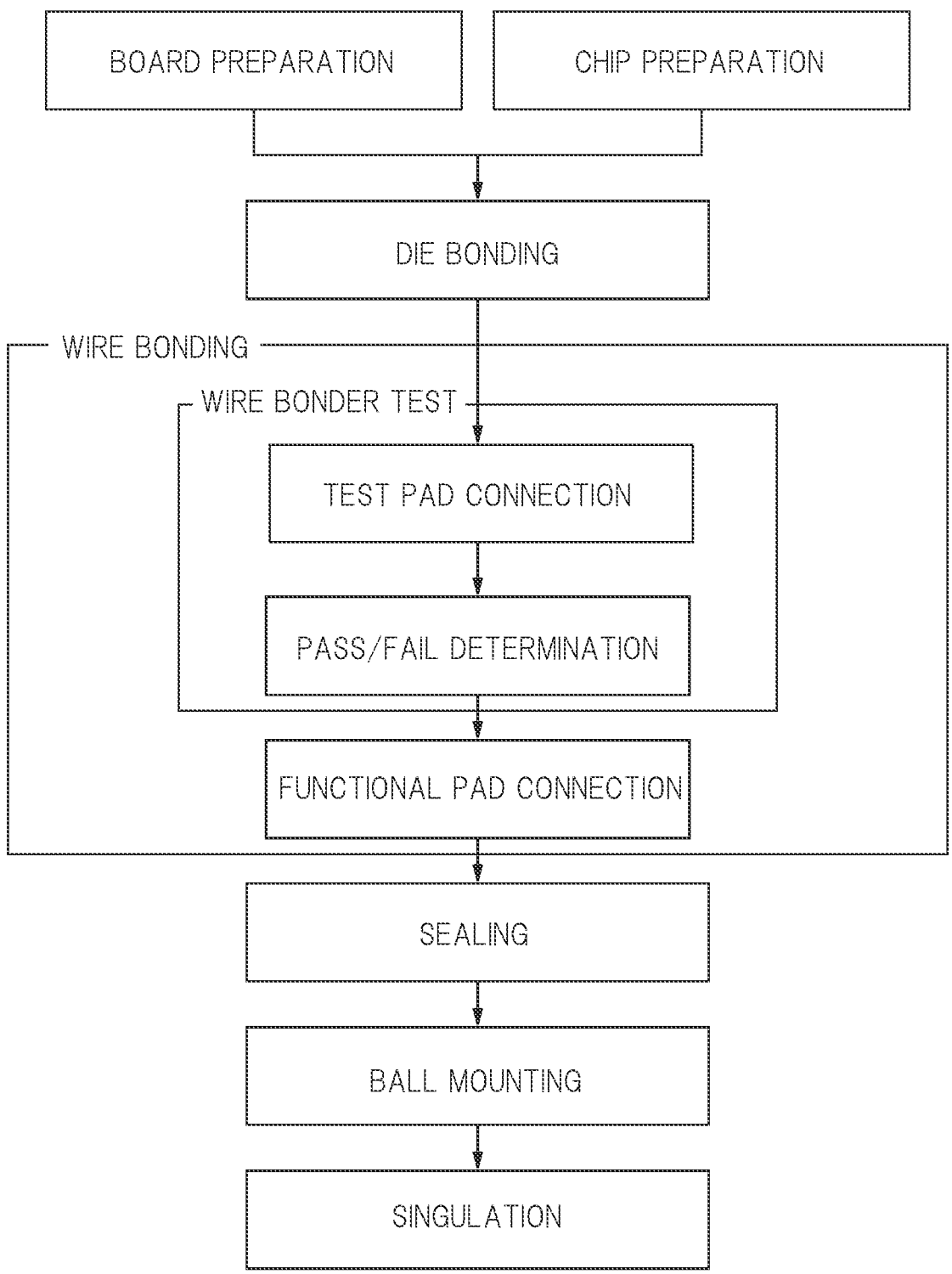
FIG. 7 is an explanatory diagram showing a flow of an assembly process of the semiconductor device described with reference to FIG. 1 to FIG. 6.

Next, the method of manufacturing the semiconductor device PKG1 described with reference to FIG. 1 to FIG. 6 will be described with reference to the flowchart shown in FIG. 7. FIG. 7 is an explanatory diagram showing a flow of an assembly process of the semiconductor device described with reference to FIG. 1 to FIG. 6. Since the semiconductor device PKG2 shown in FIG. 6 is the same as the semiconductor device PKG1 shown in FIG. 5 except that the terminal BF to which the wire BW2 is connected is changed to the terminal BF1, it is manufactured by the same manufacturing process described below. Hereinafter, the method of manufacturing the semiconductor device PKG1 will be described as a typical example.

<Board Preparation Process>

Figure 8:
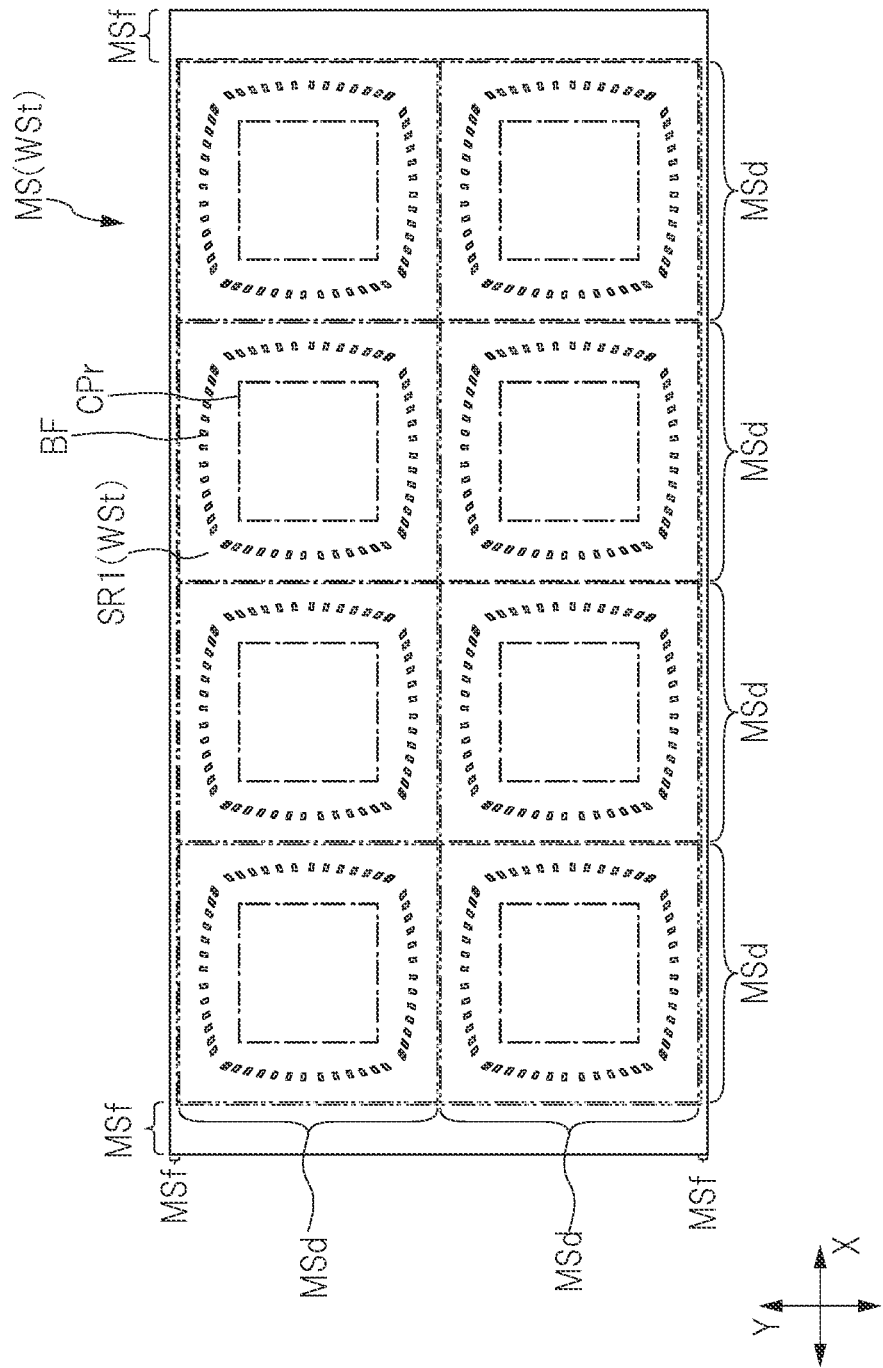
FIG. 8 is a plan view showing the overall structure of the wiring board prepared in a board preparation process shown in FIG. 7.

As the board preparation process shown in FIG. 7, a wiring board MS shown in FIG. 8 is prepared. FIG. 8 is a plan view showing the overall structure of the wiring board prepared in the board preparation process shown in FIG. 7.

As shown in FIG. 8, the wiring board MS prepared in this process includes a plurality of device regions MSd inside an outer frame (frame portion) MSf. The number of device regions MSd is not limited to that shown in FIG. 8, but the wiring board MS of the present embodiment includes, for example, eight device regions MSd. The wiring board MS is a so-called multi-piece board having the plurality of device regions MSd.

Each device region MSd corresponds to the wiring board WS shown in FIG. 4. Each member of the wiring board WS described with reference to FIG. 2 to FIG. 4 is formed in the device region MSd. As shown in FIG. 8, the device region MSd of the wiring board MS includes a plurality of terminals BF exposed from the insulating film SR1 on the upper surface WSt. The plurality of terminals BF is arranged so as to surround the chip mounting region CPr. The chip mounting region CPr is a scheduled region where the semiconductor chip CP shown in FIG. 4 is to be mounted.

<Chip Preparation Process>

Also, as the chip preparation process shown in FIG. 7, the semiconductor chip CP shown in FIG. 3, FIG. 4, and FIG. 5 is prepared. Since the structure of the semiconductor chip CP has already been described, redundant description will be omitted.

<Die Bonding Process>

Next, as the die bonding process shown in FIG. 7, the semiconductor chip CP (see FIG. 4) is mounted on the upper surface WSt of the device region MSd of the wiring board MS shown in FIG. 8. In the die bonding process, the semiconductor chip CP is mounted in each of the plurality of device regions MSd. The semiconductor chip CP is adhered and fixed on the chip mounting region CPr via the adhesive DB (see FIG. 4). In the present embodiment, the semiconductor chip CP is mounted on the wiring board MS by a so-called face-up mounting method in which the back surface CPb (see FIG. 3) and the upper surface WSt of the wiring board MS face each other.

<Wire Bonding Process>

Next, as the wire bonding process shown in FIG. 7, the wire BW is connected to each of the plurality of pads PD of the semiconductor chip CP as shown in FIG. 4. In the wire bonding process, the semiconductor chip CP and the device region MSd of the wiring board MS shown in FIG. 8 are electrically connected via the wires BW (see FIG. 4). Specifically, as shown in FIG. 3, one end of the wire BW is connected to the pad PD exposed on the front surface CPt of the semiconductor chip CP, and the other end is bonded to the terminal BF on the upper surface WSt of the wiring board MS.

In the wire bonding process, the wires BW are bonded using the wire bonding apparatus described later, and it is preferable to monitor the operating state of the wire bonding apparatus in order to correctly bond a large number of wires BW. As a method of monitoring the operating state of the wire bonding apparatus, a method of preparing a dedicated semiconductor chip for testing the connection state of the wire BW is conceivable. In this case, one of the plurality of device regions MSd shown in FIG. 8 is set as the device region MSd for the wire connection test, and the semiconductor chip CP for the test is mounted in this device region MSd. In this case, the wire connection test can be performed for each wiring board MS which is a multi-piece board, but the number of products that can be obtained from the wiring board MS decreases because the device region MSd to which the test has been performed cannot be used as the product. For example, in the case of the example shown in FIG. 8, since one of the eight device regions MSd is used for the wire connection test, only seven products can be obtained at the maximum.

On the other hand, in the case of the present embodiment, since the semiconductor chip CP to be a product is provided with the pad PD2 for the wire connection test, it is possible to suppress the decrease in the number of products that can be obtained from the wiring board MS (see FIG. 8) even when the wire connection test is performed with great frequency. For example, in the case of the example shown in FIG. 8, eight products can be obtained from the eight device regions MSd at the maximum. As described above, according to the present embodiment, even if the frequency of the wire connection test is increased, the decrease in the manufacturing efficiency of the semiconductor device can be suppressed. The details of the wire bonding process other than the above will be described later.

<Sealing Process>

Next, as the sealing process shown in FIG. 7, the semiconductor chip CP is sealed with resin to form the sealing body MR (see FIG. 1 and FIG. 3). In this process, the plurality of device regions MSd is collectively covered with one sealing body MR.

<Ball Mounting Process>

Next, as the ball mounting process shown in FIG. 7, the plurality of solder balls SB (see FIG. 2 and FIG. 3) are bonded to the plurality of lands LD (see FIG. 2 and FIG. 3) formed on the lower surface of the wiring board MS. In this process, after arranging the solder ball SB on each of the plurality of lands LD exposed on the lower surface of the wiring board MS, the plurality of solder balls SB and the lands LD are bonded by applying heat. By this process, the plurality of solder balls SB are electrically connected to the semiconductor chip CP via the wiring board MS.

<Singulation Process>

Next, as the singulation process shown in FIG. 7, the wiring board MS and the sealing body MR are cut along the cutting regions surrounding each of the plurality of device regions MSd shown in FIG. 8, thereby singulating the plurality of device regions MSd.

Through the processes described above, the semiconductor device PKG1 described with reference to FIG. 1 to FIG. 4 can be obtained. Thereafter, necessary inspections and tests such as visual inspection and electrical test are performed, and the semiconductor device PKG1 is shipped or mounted on a mounting board (not shown).

<Details of Wire Bonding Process>

Figure 9:
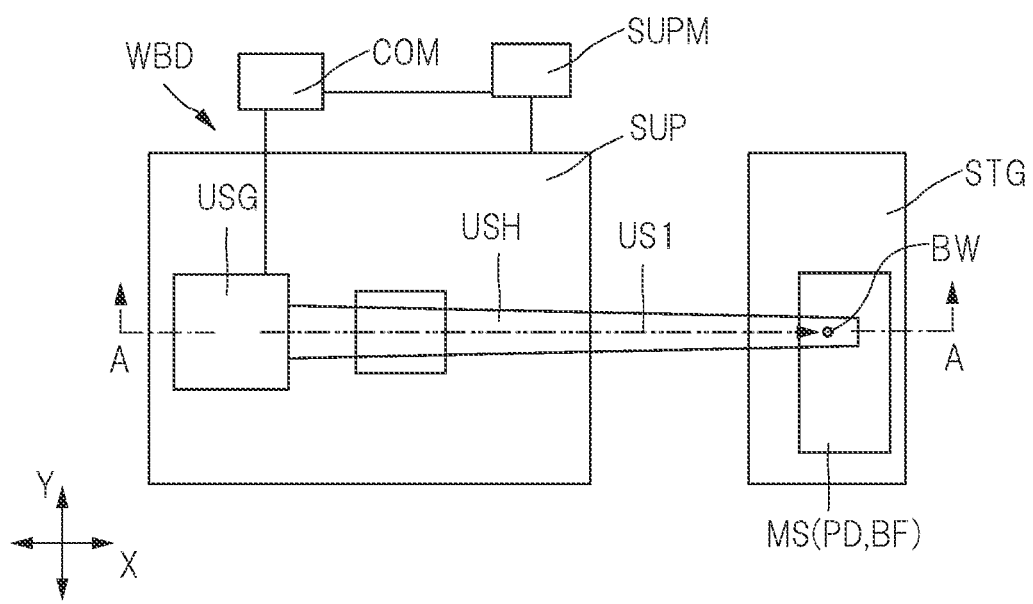
FIG. 9 is a plan view showing a positional relationship between a wire bonding apparatus used in the wire bonding process shown in FIG. 7 and a wire bonding target (electrode pad or terminal).
Figure 10:
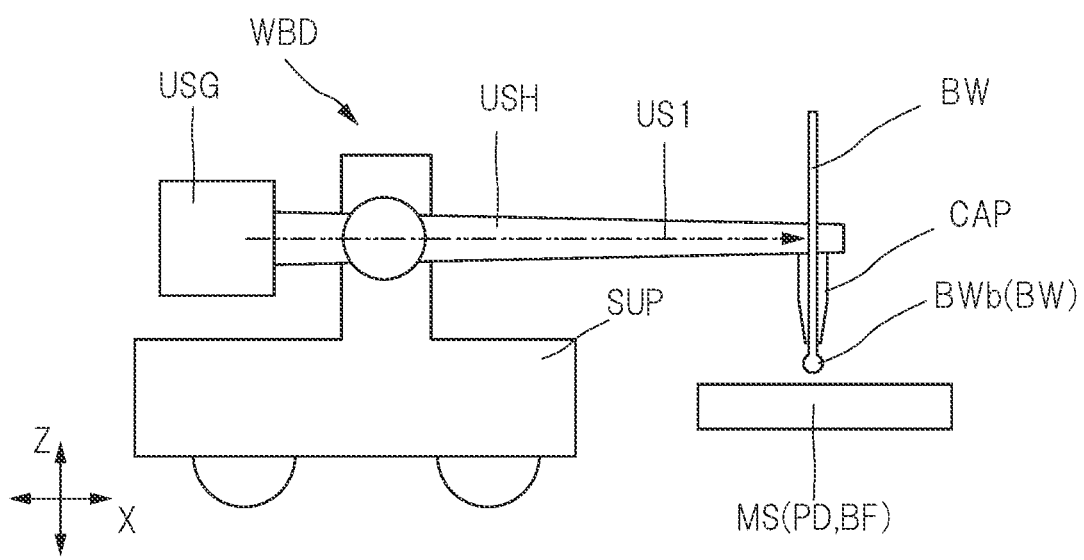
FIG. 10 is a cross-sectional view schematically showing a cross-section along a line A-A in FIG. 9.

Next, the details of the wire bonding process shown in FIG. 7 will be described. As shown in FIG. 7, the wire bonding process includes a test pad connecting process, a pass/fail determination process, and a functional pad connecting process. Hereinafter, a configuration example of the wire bonding apparatus used in the wire bonding process will be described, and then each process will be sequentially described. FIG. 9 is a plan view showing a positional relationship between the wire bonding apparatus used in the wire bonding process shown in FIG. 7 and a wire bonding target (electrode pad or terminal). FIG. 10 is a cross-sectional view schematically showing a cross-section along a line A-A in FIG. 9.

In the wire bonding process of the present embodiment, for example, the wire bonding apparatus WBD is arranged next to a stage STG to which the wiring board MS is fixed as shown in FIG. 9. For example, the wiring board MS and the wire bonding apparatus WBD are arranged in the positional relationship shown in FIG. 9. Namely, the wire bonding apparatus WBD is arranged such that a horn USH extends in an X direction in a plan view, and the wiring board MS is arranged on the opposite side of an oscillator USG with the horn USH interposed therebetween. In this manner, an ultrasonic wave US1 vibrating along the X direction can be applied to a ball portion BWb (see FIG. 10) of the wire BW.

Further, the wire bonding apparatus WBD has a support portion SUP that supports a bonding head portion including a capillary CAP, the horn USH, and the oscillator USG shown in FIG. 10. The support portion SUP can be freely moved along an X-Y plane shown in FIG. 9, and can connect the wire BW to each of the plurality of pads PD of the wiring board MS by moving the position of the bonding head together with the support portion SUP.

In the test pad connecting process and the functional pad connecting process included in the wire bonding process, the wire bonding is performed as follows.

First, the wire bonding process of the present embodiment includes a ball bonding process in which the ball portion BWb is formed at an end of the wire BW protruding from a lower end side of the capillary CAP and then the ball portion BWb is bonded to a bonding target on a first bonding side (for example, pad PD) as shown in FIG. 10. The ball portion BWb is formed by discharging at the tip of the wire BW from an electric torch (not shown). In the ball bonding process, the load applied to the ball portion BWb of the wire BW is transmitted to the ball portion BWb via the capillary CAP by pushing down the tip portion of the horn USH to which the capillary CAP is fixed. Further, in the ball bonding process, ultrasonic waves are applied to the ball portion BWb via the capillary CAP while applying a load to the bonding target via the ball portion BWb.

Also, the wire bonding process of the present embodiment includes a wire forming process of forming the shape of the wire BW by moving the position of the capillary CAP while sending out the wire BW from the capillary CAP, after the ball bonding process.

Further, the wire bonding process of the present embodiment includes a second bonding process of bonding a part of the wire BW to a bonding target (for example, terminal BF) on a second bonding side, after the wire forming process. The wire BW is cut after the second bonding process, so that the wire BW connecting the pad PD and the terminal BF as shown in FIG. 3 is formed.

In the test pad connecting process shown in FIG. 7, the wire BW2 (see FIG. 5) is connected to the pad PD2 (see FIG. 5) which is a test pad. Also, in the test pad connecting process, in order to confirm the operating state of the wire bonding apparatus shown in FIG. 9 and FIG. 10, the changes in the current or voltage that controls the operation of the wire bonding apparatus WBD (see FIG. 9) when bonding the wire BW2 (see FIG. 5) is measured. The measured data is transmitted to a computer (control device) COM (see FIG. 9) connected to the wire bonding apparatus WBD, and the measurement result is evaluated in the next pass/fail determination process. In the example shown in FIG. 9, the computer COM is connected to the oscillator USG and a motor SUPM.

There are various modifications of the current or voltage to be measured, and the following examples can be presented. In the ball bonding process described above, the ultrasonic waves applied to the ball portion BWb shown in FIG. 10 are supplied from the oscillator USG. Therefore, as a first example, in the test pad connecting process, the voltage waveform or the current waveform supplied to the oscillator USG is measured. For example, when a foreign substance or the like is present on the surface of the pad PD, the friction between the ball portion BWb and the pad PD differs. Here, it is assumed that the oscillator USG uses a piezo element as one of the components. The voltage waveform or the current waveform supplied to the piezo element is a command for controlling the ultrasonic waves output by the oscillator USG. Further, in the wire bonding apparatus WBD, in order to control the ultrasonic waves output by the oscillator USG to be constant, the current waveform or the voltage waveform generated in the piezo element is monitored while the ball portion BWb is bonded to the pad PD, and the voltage waveform or the current waveform for the command is adjusted, thereby controlling the ultrasonic waves to be output to be constant. Therefore, when the friction between the ball portion BWb and the pad PD differs, the current waveform or the voltage waveform applied to the piezo element also differs, and if a threshold value is set for the value of the voltage waveform or the current waveform generated as a result of the command to control the operation or the operation, the abnormality can be detected when the value falls below the threshold value or exceeds the threshold value. Since the friction between the ball portion BWb and the pad PD differs not only when a foreign substance is present on the surface of the pad PD but also when the size of the ball portion BWb and the strength of the bond between the ball portion BWb and the pad PD differ, this abnormality detection is effective as abnormality detection in the wire bonding process.

Also, for example, in the ball bonding process, the ball portion BWb may be operated in the planar direction (scrub operation) in a state where the ball portion BWb is in contact with the pad PD before applying ultrasonic waves. This scrub operation is performed by, for example, operating the support portion SUP in the planar direction. Therefore, as a second example, in the test pad connecting process, the voltage waveform or the current waveform supplied to the motor SUPM that drives the support portion SUP is measured.

Next, in the pass/fail determination process, the pass or fail of the machining operation by the wire bonding apparatus WBD is determined based on the measured data obtained by the test pad connecting process. In this process, as described above, a threshold value is set in advance for the voltage waveform or the current waveform measured in the test pad connecting process, and the computer COM determines that the abnormality is present when the value falls below or exceeds the threshold value. When the computer COM determines that the abnormality is present, the computer COM transmits an abnormality detection signal to, for example, a display device (not shown). Alternatively, when the computer COM determines that the abnormality is present, the computer COM may stop the operation of the wire bonding process.

In the functional pad connecting process shown in FIG. 7, the wire BW1 is sequentially bonded to each of the plurality of pads PD1 shown in FIG. 5 by the wire bonding apparatus (see FIG. 9). The pad PD1 connected in the functional pad connecting process is the pad PD necessary for exerting the function when the product is used, and if there is the abnormality in wire bonding, it causes the decrease in the reliability of the product. In the case of the present embodiment, the functional pad connecting process is performed after confirming that there is no problem in the operating state of the wire bonding apparatus WBD by performing the test pad connecting process and the pass/fail determination process immediately before the functional pad connecting process is performed. Therefore, the connection state of the wire BW1 connected to each of the plurality of pads PD1 is maintained in a favorable state.

In the example shown in FIG. 7, the functional pad connecting process is performed after the test pad connecting process and the pass/fail determination process. By performing the wire bonder test process (wire bonding apparatus test process) including the test pad connecting process and the pass/fail determination process before the functional pad connecting process, waste of work when the abnormality is detected in the wire bonder test process can be eliminated. However, as a modification, the functional pad connecting process may be performed before the wire bonder test process including the test pad connecting process and the pass/fail determination process. Even in this case, when the abnormality is detected during the process for the plurality of device regions MSd (see FIG. 8), the waste of work can be eliminated because the work of the wire bonding process for the device regions MSd in which the process has not been performed yet can be stopped.

By the way, in the case of the present embodiment, the setting conditions of the wire bonding apparatus BWD (see FIG. 10) when bonding the wire BW2 to the pad PD2 shown in FIG. 5 in the test pad connecting process and the setting conditions of the wire bonding apparatus BWD (see FIG. 10) when bonding the wires BW1 to the plurality of pads PD1 shown in FIG. 5 in the functional pad connecting process are different from each other. Of course, as a modification, the setting conditions of the wire bonding apparatus BWD may be the same in the test pad connecting process and the functional pad connecting process.

When focusing on the detection accuracy of the abnormality in the operating state of the wire bonding apparatus in the wire connection test, it is not always optimal to perform the wire connection test under the same conditions as the functional pad connecting process. For example, a load is applied to the pad PD via the ball portion BWb shown in FIG. 10 in the above-mentioned ball bonding process, and the detection of the abnormality in the operating state of the wire bonding apparatus BWD may become easier by making the load applied in the test pad connecting process larger than the load applied in the functional pad connecting process. Also, for example, ultrasonic waves are applied to the ball portion BWb in the above-mentioned ball bonding process, and the detection of the abnormality in the operating state of the wire bonding apparatus BWD may become easier by increasing the amplitude of the ultrasonic waves or gradually increasing the amplitude of the ultrasonic waves. Further, in the ball bonding process described above, there is also a method of changing the operating range of the scrub operation.

As described above, the wire bonding apparatus WBD controls the current waveform and the voltage waveform given as commands in accordance with the current waveform and the voltage waveform generated by the operation of the wire bonding apparatus WBD. Therefore, it is possible to easily detect the abnormality by operating the wire bonding apparatus WBD under the conditions in which the state of the current or voltage that controls the operation of the wire bonding apparatus WBD is likely to change.

For example, when the intensity of the output ultrasonic wave is weakened due to the failure of the oscillator USG, the contribution of the output ultrasonic wave to the bonding between the ball portion BWb and the pad PD is more weakened compared with the normal state as the load is larger. Therefore, by measuring the current or voltage that controls the operation of the oscillator USG in the state where the load larger than usual is applied, the friction between the ball portion BWb and the pad PD is reduced, and the change and abnormality in the command to the oscillator USG and the current waveform and voltage waveform that occur in the piezo element can be easily detected.

It is also possible to gradually change the amplitude of ultrasonic waves. Since the state of output control and bonding which can be expressed by a certain function under normal conditions changes when the abnormality occurs, the fact that the intended control and bonding cannot be performed can be detected as information of the function by changing the output stepwise, and the accuracy of abnormality detection is improved compared with the case of determination by one operation.

In the case of the present embodiment, as described with reference to FIG. 5, the semiconductor chip CP includes the pad PD2 dedicated to the wire connection test. Therefore, even when the pad PD2 is damaged as a result of applying a higher load than that in the functional pad connecting process to the pad PD2 (see FIG. 5) in the test pad connecting process, the circuit 10 (see FIG. 5) of the semiconductor chip CP is not affected.

Further, the embodiment in which the wire bonding process is stopped as a countermeasure when an abnormality is detected in the pass/fail determination process shown in FIG. 7 has been described, but it is also possible to change the operation of the wire bonding apparatus WBD so as to be optimized based on the measured data without stopping the wire bonding process depending on the degree of abnormality or the contents of abnormality. In this case, in the pass/fail determination process, the computer COM shown in FIG. 9 changes the setting conditions of the wire bonding apparatus WBD based on the pass/fail determination result, and then performs the functional pad connecting process.

In the method of manufacturing the semiconductor device in which the setting conditions of the wire bonding apparatus WBD are optimized based on the determination result in the pass/fail determination process as described above, it is necessary to detect a slight change in the measured voltage or current. Therefore, in addition to simply measuring the voltage value and the current value and evaluating the magnitude relationship with the preset threshold value, the following evaluation is preferably performed.

Namely, the test pad connecting process shown in FIG. 7 is repeatedly performed to the plurality of pads PD2 (see FIG. 5). In the pass/fail determination process, the computer COM shown in FIG. 10 determines whether or not it is necessary to change the setting conditions of the wire bonding apparatus WBD based on the changes in the measured data obtained by the test pad connecting process performed plural times. For example, when the plurality of pads PD2 is formed on one semiconductor chip CP, it is possible to determine whether or not it is necessary to change the setting conditions of the wire bonding apparatus WBD during the wire bonding process for one semiconductor chip CP. Also, when one semiconductor chip CP includes one pad PD2, the test pad connecting process is performed to the pad PD2 included in each of the plurality of semiconductor chips CP mounted in the plurality of device regions MSd shown in FIG. 8, and it is possible to determine whether or not it is necessary to change the setting conditions of the wire bonding apparatus WBD based on the changes in the measured data obtained by the test pad connecting process performed plural times.

As described above, in the case of the method in which it is determined whether or not it is necessary to change the setting conditions of the wire bonding apparatus WBD based on the changes in the measured data obtained by the test pad connecting process performed plural times, it takes time for determination because the measurement needs to be repeatedly performed as a premise, but even a slight change can be detected. On the other hand, as described above, the method in which the pass/fail determination is performed by comparing the voltage or current value of the wire bonding apparatus WBD with the threshold value is superior in that the time until determination is short. Further, it is particularly preferable to use both the method in which the pass/fail determination is performed by comparing the voltage or current value of the wire bonding apparatus WBD with the threshold value and the method in which it is determined whether or not it is necessary to change the setting conditions of the wire bonding apparatus WBD based on the changes in the measured data obtained by the test pad connecting process performed plural times.

Also, the pad PD2 and each of the plurality of pads PD1 shown in FIG. 5 are preferably the same in the material, the thickness, and the material of a structure (for example, an inorganic insulating film such as silicon oxide) arranged as a base. Further, the wire BW2 connected to the pad PD2 and the wire BW1 connected to each of the plurality of pads PD1 are preferably the same in the material and the diameter of the ball portion BWb (see FIG. 10). This is because since it is conceivable that the resistance component (for example, frictional force) between the members to be bonded in the above-mentioned ball bonding process has a large influence on the measured data in the test pad connecting process, the pass/fail determination can be easily performed when conditions such as the material, the thickness, and the contact area of the members to be bonded are made uniform.

In the foregoing, the invention made by the inventors has been specifically described based the embodiments, but it is needless to say that the present invention is not limited to the embodiments described above and can be variously modified within the range not departing from the gist thereof.

What is claimed is:

1. A method of manufacturing a semiconductor device comprising steps of:
   (a) preparing a semiconductor chip having a first main surface, a second main surface on an opposite side of the first main surface, and a plurality of electrode pads exposed on the first main surface; and
   (b) after the (a), connecting wires to the plurality of electrode pads, respectively,
   wherein the plurality of electrode pads includes:
      a plurality of first electrode pads which is electrically connected to a circuit included in the semiconductor chip and to which first wires are bonded in the (b); and
      a second electrode pad to which a second wire is bonded in the (b), and
   wherein the (b) includes steps of:
      (b1) bonding the second wire to the second electrode pad by using a wire bonding apparatus and measuring a current or a voltage which controls an operation of the wire bonding apparatus at the time of bonding the second wire;
      (b2) determining pass or fail of a machining operation by the wire bonding apparatus based on measured data obtained in the (Ill); and
      (b3) sequentially bonding the first wires to the plurality of first electrode pads, respectively, by using the wire bonding apparatus.

2. The method of manufacturing the semiconductor device according to claim 1, wherein the (b3) is performed after the (b2).

3. The method of manufacturing the semiconductor device according to claim 1, wherein setting conditions of the wire bonding apparatus at the time of bonding the second wire to the second electrode pad in the (b1) are different from setting conditions of the wire bonding apparatus at the time of bonding the first wires to the plurality of first electrode pads in the (b3).

4. The method of manufacturing the semiconductor device according to claim 1,
   wherein the wire bonding apparatus includes an oscillator which supplies ultrasonic waves to a bonding portion between the second wire and the second electrode pad in the (b1), and
   wherein a current or a voltage which controls an operation of the oscillator is measured in the (b1).

5. The method of manufacturing the semiconductor device according to claim 2, wherein the (b) further includes a step of:
   (b4) after the (b2) and before the (b3), changing setting conditions of the wire bonding apparatus based on a result of determination of pass or fail of a machining operation by the wire bonding apparatus.

6. The method of manufacturing the semiconductor device according to claim 2,
   wherein the (b1) is repeatedly performed to a plurality of the second electrode pads, and
   wherein, in the (b2), whether or not the setting conditions of the wire bonding apparatus are changed is determined based on a change in measured data obtained in the (b1) performed plural times.

\* \* \* \* \*